(12) United States Patent
Mebarki et al.

(10) Patent No.: US 7,972,959 B2
(45) Date of Patent: Jul. 5, 2011

(54) SELF ALIGNED DOUBLE PATTERNING FLOW WITH NON-SACRIFICIAL FEATURES

(75) Inventors: Bencherki Mebarki, Santa Clara, CA (US); Li Yan Miao, San Francisco, CA (US); Kenlin C. Huang, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 22 days.

(21) Appl. No.: 12/326,068

(22) Filed: Dec. 1, 2008

(65) Prior Publication Data

US 2010/0136784 A1    Jun. 3, 2010

(51) Int. Cl.
*H01L 21/44* (2006.01)
(52) U.S. Cl. .................. 438/669; 257/E21.295
(58) Field of Classification Search .................. 438/669, 438/301, 241, 328, 401, 364, 736, 703, 947, 438/942; 257/104, 105, E21.295
See application file for complete search history.

(56) References Cited

U.S. PATENT DOCUMENTS

| 4,758,528 | A | * | 7/1988 | Goth et al. ..................... 438/514 |
| 5,393,233 | A | * | 2/1995 | Hong et al. .................... 438/289 |
| 6,143,613 | A | * | 11/2000 | Lin ................................. 438/299 |
| 6,982,221 | B1 | | 1/2006 | Hsu |
| 7,064,078 | B2 | | 6/2006 | Liu et al. |
| 7,105,099 | B2 | | 9/2006 | Chung et al. |
| 2003/0001273 | A1 | * | 1/2003 | Steiner et al. ................. 257/760 |
| 2003/0232495 | A1 | * | 12/2003 | Moghadam et al. .......... 438/623 |
| 2004/0017989 | A1 | * | 1/2004 | So .................................. 385/129 |
| 2006/0228895 | A1 | | 10/2006 | Chae et al. |
| 2007/0148968 | A1 | | 6/2007 | Kwon et al. |
| 2008/0081461 | A1 | * | 4/2008 | Lee et al. ....................... 438/637 |
| 2008/0090418 | A1 | * | 4/2008 | Jeon et al. ..................... 438/689 |
| 2008/0194108 | A1 | * | 8/2008 | Kim et al. ..................... 438/703 |

OTHER PUBLICATIONS

Smayling et al, "APF® Pitch-Halving for 22 nm Logic Cells using Gridded Design Rules", Mar. 4, 2008, Proceedings SPIE, vol. 6925, p. 6925 1E-1-6925 1E-8.*
Hand, A., "Double Patterning Wrings More From Immersion Lithography," (2007) Semiconductor International, 30(2):40.
Hand, A., "Applied's Litho Scheme: Patterning vs. Printing," (2007) Semiconductor International, 1-2.
Vogt, M., et al., "Introduction of PECVD Carbon Hardmasks (APF™) For Sub-90NM Dram Technology," (2004) Photolithography, 528-540.

* cited by examiner

*Primary Examiner* — Thomas L Dickey
*Assistant Examiner* — Nikolay Yushin
(74) *Attorney, Agent, or Firm* — Kilpatrick Townsend & Stockton LLP

(57) ABSTRACT

Embodiments of the present invention pertain to methods of forming features on a substrate using a self-aligned double patterning (SADP) process. A conformal layer of non-sacrificial material is formed over features of sacrificial structural material patterned near the optical resolution of a photolithography system using a high-resolution photomask. An anisotropic etch of the non-sacrificial layer leaves non-sacrificial ribs above a substrate. A gapfill layer deposited thereon may be etched or polished back to form alternating fill and non-sacrificial features. No hard mask is needed to form the non-sacrificial ribs, reducing the number of processing steps involved.

16 Claims, 7 Drawing Sheets

SELF ALIGNED DOUBLE PATTERNING FLOW WITH NON-SACRIFICIAL FEATURES

BACKGROUND

The application relates generally to substrate processing methods and particularly to process sequences which increase the density of features on the substrate.

Shrinking integrated circuits (ICs) may result in improved performance, increased capacity and/or reduced cost. Each device shrink requires more sophisticated techniques to form the features. Photolithography is commonly used to pattern features on a substrate. An exemplary feature is a line of a material which may be a metal, semiconductor or insulator. Linewidth is the width of the line and the spacing is the distance between adjacent lines. Pitch is defined as the distance between a same point on two neighboring lines. The pitch is equal to the sum of the linewidth and the spacing. Due to factors such as optics and light or radiation wavelength, however, photolithography techniques have a minimum pitch below which a particular photolithographic technique may not reliably form features. Thus, the minimum pitch of a photolithographic technique can limit feature size reduction.

Self-aligned double patterning (SADP) is one method for extending the capabilities of photolithographic techniques beyond their supposed minimum pitch. Such a method is illustrated in FIGS. 1A-H. With reference to FIG. 1A, patterned features 102 are formed from sacrificial structural material above a dielectric layer 114 on a substrate 100 using standard photo-lithography and etching techniques. The patterned features are referred to as placeholders, mandrels or cores and have linewidths and/or spacings near the optical resolution of a photolithography system using a high-resolution photomask. As shown in FIG. 1B, a conformal layer 106 of hard mask material is subsequently deposited over cores 102. Hard mask spacers 108 are then formed on the sides of cores 102 by preferentially etching the hard mask material from the horizontal surfaces with an anisotropic spacer etch. The resulting structure is shown in FIG. 1C. Cores 102 may then be removed, leaving behind hard mask spacers 108 (FIG. 1D). At this point hard mask spacers 108 may be used as an etch mask for transferring the pattern to the dielectric layer 114 to form dielectric ribs 116, as shown in FIG. 1E. The hard mask spacers 108 are subsequently removed (FIG. 1F).

The density of the dielectric ribs 116 is twice that of the photo-lithographically patterned features 102, the pitch of dielectric ribs 116 is half the pitch of patterned features 102. A metal layer 130 is deposited over the dielectric ribs 116 and exposed portions of the substrate 100 (FIG. 1G) and subsequently etched back or polished to form metal lines 132 between the dielectric ribs 116 as shown in FIG. 1H.

BRIEF SUMMARY

Embodiments of the present invention pertain to methods of forming features on a substrate using a self-aligned double patterning (SADP) process. A conformal layer of non-sacrificial material is formed over features of sacrificial structural material patterned near the optical resolution of a photolithography system using a high-resolution photomask. An anisotropic etch of the non-sacrificial layer leaves non-sacrificial ribs above a substrate. A gapfill layer deposited thereon may be etched or polished back to form alternating fill and non-sacrificial features. No hard mask is needed to form the non-sacrificial ribs, reducing the number of processing steps involved. For a dielectric non-sacrificial rib material, the gapfill layer may be a metal layer. For a polysilicon non-sacrificial rib material, a dielectric gapfill layer may be used. In either case, no hard mask is needed to form the non-sacrificial ribs, reducing the number of steps involved.

In an embodiment, a method of forming patterned metal features on a substrate includes forming a layer of sacrificial structural material on the substrate and patterning the layer of sacrificial structural material using a photolithography process to form a plurality of cores with first linewidths separated by first trenches and spaced according to a first pitch. The method further includes forming a conformal layer of a dielectric spacer material over the plurality of cores without completely filling the first trenches there between and anisotropically etching the conformal layer to expose the plurality of patterned sacrificial structures. The method also includes stripping away the exposed plurality of cores leaving a plurality of non-sacrificial dielectric spacers separated by second trenches and spaced according to a second pitch that is less than the first pitch. Additional steps present include filling the trenches between the plurality of non-sacrificial dielectric spacers by forming a metal layer over the non-sacrificial spacers and planarizing the substrate to create a substantially planar surface comprising areas of dielectric spacer material and areas of metal defining the patterned metal features.

In another embodiment a method of forming patterned polysilicon features on a substrate includes forming a layer of sacrificial structural material on the substrate and patterning the layer of sacrificial structural material using a photolithography process to form a plurality of cores with first linewidths separated by first trenches and spaced according to a first pitch. The method further includes forming a conformal layer of a polysilicon material over the plurality of cores without completely filling the first trenches there between and anisotropically etching the conformal layer to expose the plurality of cores. The method also includes stripping away the exposed plurality of cores leaving a plurality of non-sacrificial polysilicon features separated by second trenches and spaced according to a second pitch that is less than the first pitch. Additional steps present include filling the trenches between the plurality of non-sacrificial polysilicon features by depositing a dielectric gapfill layer over the polysilicon features and planarizing the substrate to create a substantially planar surface comprising areas of polysilicon separated by areas of dielectric defining the patterned polysilicon features.

Further areas of applicability of the present disclosure will become apparent from the detailed description provided hereinafter. It should be understood that the detailed description and specific examples, while indicating various embodiments, are intended for purposes of illustration only and are not intended to necessarily limit the scope of the disclosure.

BRIEF DESCRIPTION OF THE DRAWINGS

A further understanding of the nature and advantages of the invention may be realized by reference to the remaining portions of the specification and the drawings, presented below. The Figures are incorporated into the detailed description portion of the invention.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Embodiments of the present invention pertain to methods of forming features on a substrate using a self-aligned double patterning (SADP) process. A conformal layer of non-sacrificial material is formed over features of sacrificial structural material patterned near the optical resolution of a photolithography system using a high-resolution photomask. An anisotropic etch of the non-sacrificial layer leaves non-sacrificial ribs above a substrate. A gapfill layer deposited thereon may be etched or polished back to form alternating fill and non-sacrificial features. No hard mask is needed to form the non-sacrificial ribs, reducing the number of processing steps involved.

Figure 1A:
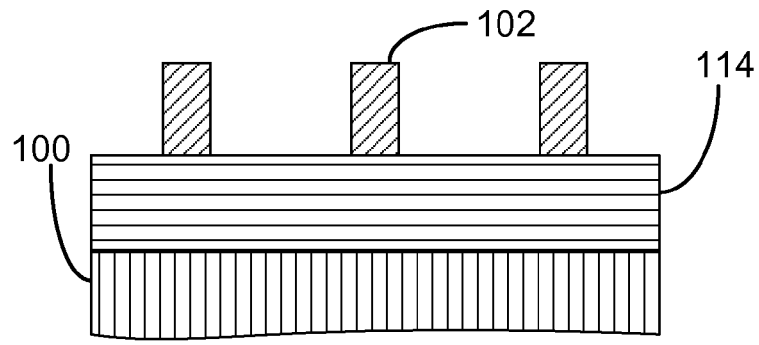
FIGS. 1A-H illustrate cross-sectional views representing a conventional self-aligned double patterning (SADP) process in accordance with the prior art.
Figure 1B:
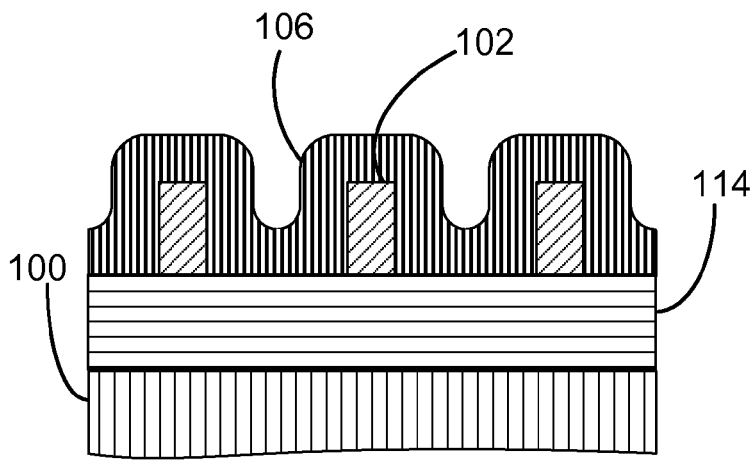
Figure 1C:
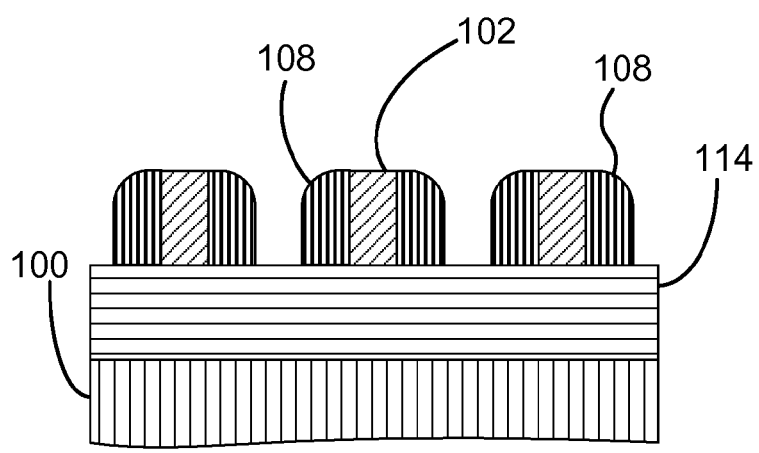
Figure 1D:
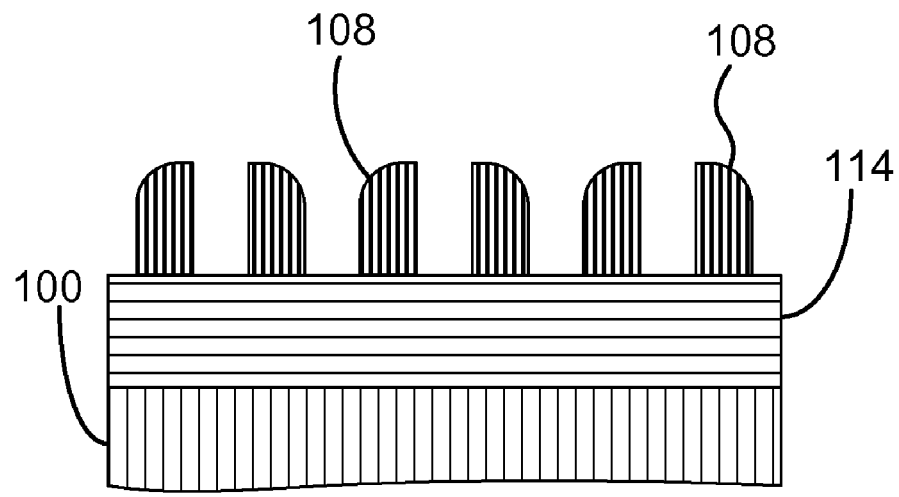
Figure 1E:
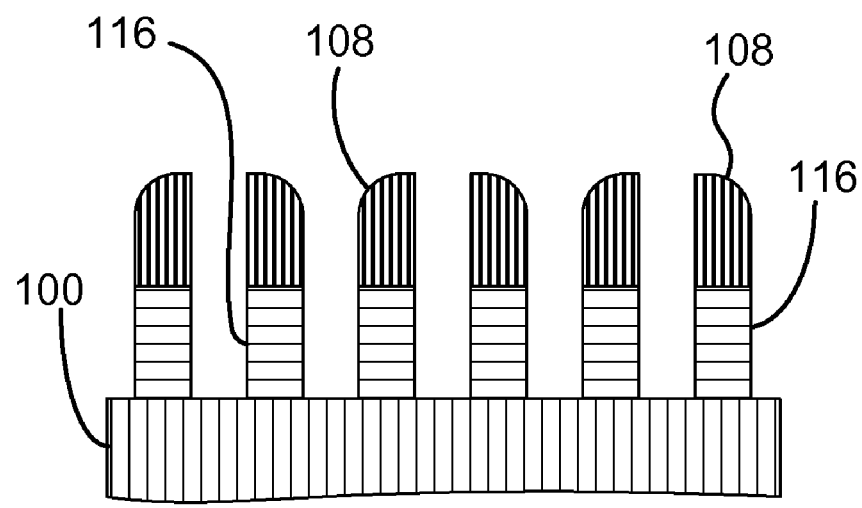
Figure 1F:
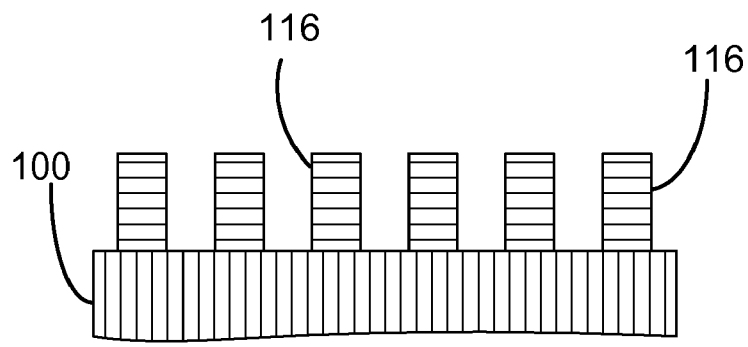
Figure 1G:
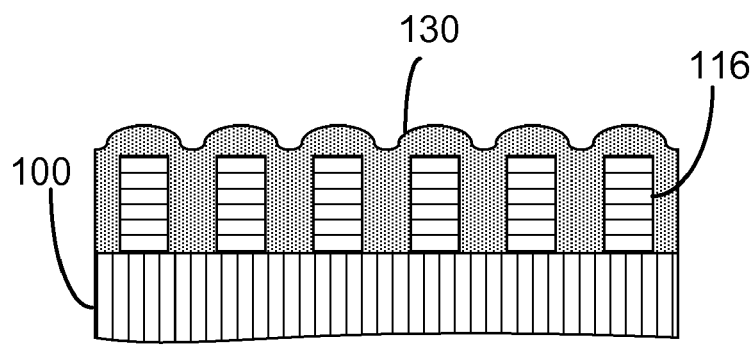
Figure 1H:
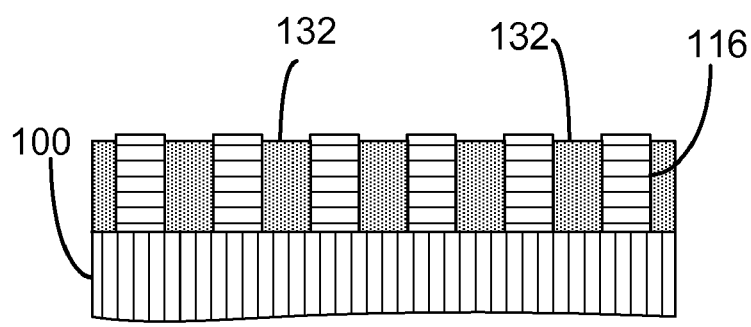
Figure 2:
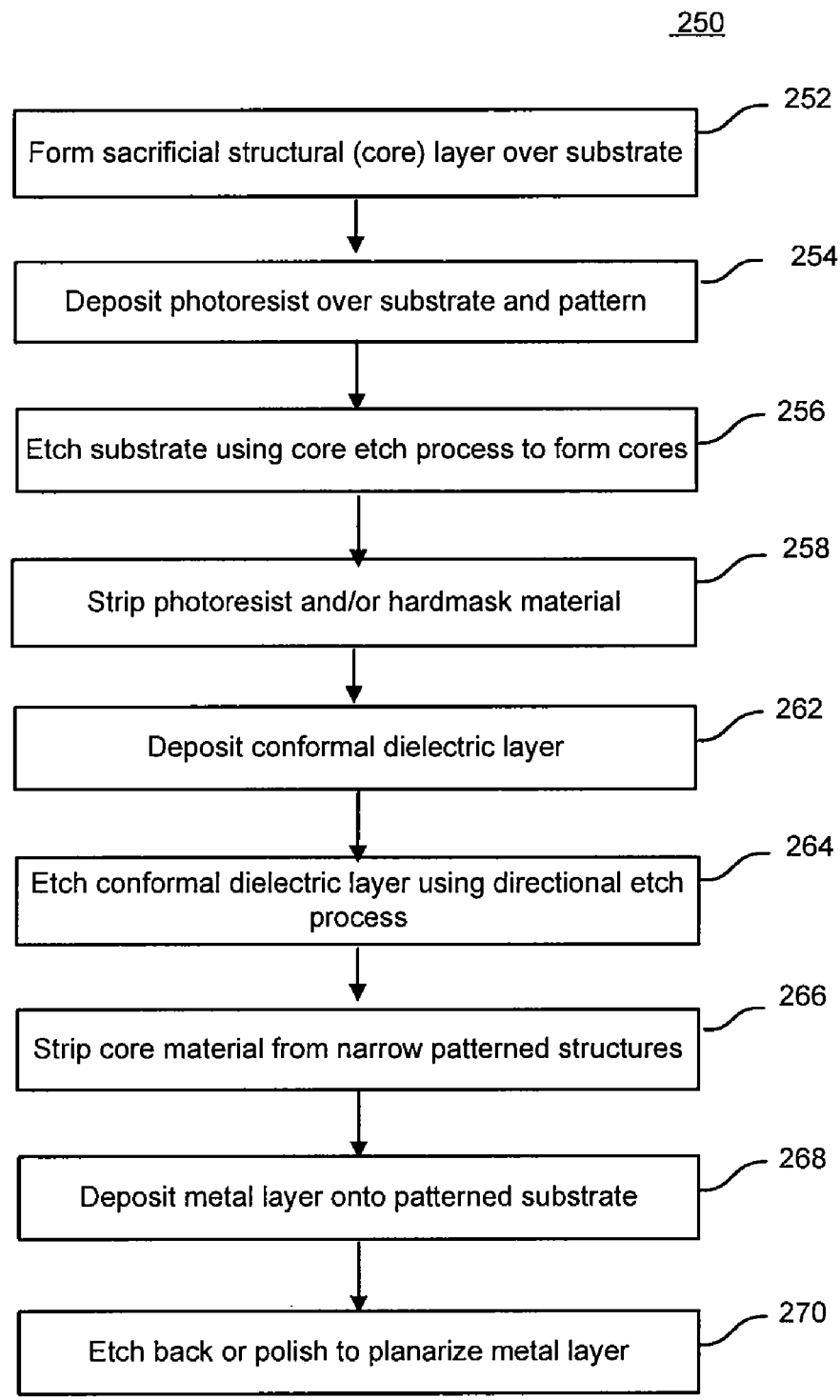
FIG. 2 is a flowchart depicting steps associated with a self-aligned double patterning process according to one embodiment of the invention.

In order to better understand and appreciate the invention, reference is made to FIG. 2, which is a flowchart depicting steps associated with a self-aligned double patterning process according to one embodiment of the invention, and FIGS. 3A-F, which illustrate cross-sectional views of a structure as it is formed by the steps set forth in FIG. 2. The method starts by forming a sacrificial structural layer (sometimes referred to as a core layer) on a substrate (Step 252). The sacrificial structural layer is then coated with photoresist, the photoresist is patterned and developed (Step 254). The pattern is transferred into the core layer (Step 256) with an etch process to form cores 302 on the substrate 300. The core layer may contain significant amounts of carbon, in which case the photoresist layer and the core layer may etch by similar mechanisms and a hard mask layer may need to be formed in-between. The hard mask layer would be patterned using the photoresist as a mask, and then the pattern may be transferred into the sacrificial structural layer in a separate etch step. Next, any residual photoresist is removed (Step 258 resulting in the structure shown in FIG. 3A) using, for example a standard photoresist stripping process. Hard mask material, when used, is removed at this point as well. With this process, the cores 302 may be patterned at or near the resolution limit of a photolithography process. In practice, integrated circuits will possess a variety of lines and spacings. The cross-sectional views in FIGS. 3A-F depict a densely patterned portion of the integrated circuit having relatively small pitch, linewidth and spacing.

Figure 3A:
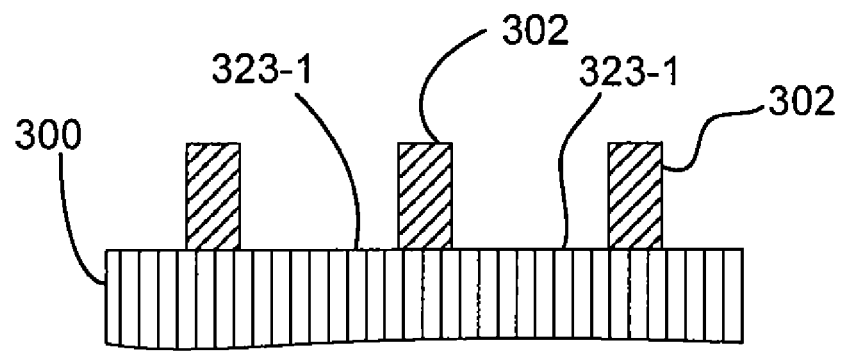
FIGS. 3A-F illustrate cross-sectional views representing a self-aligned double patterning (SADP) process according to an embodiment of the invention.
Figure 3B:
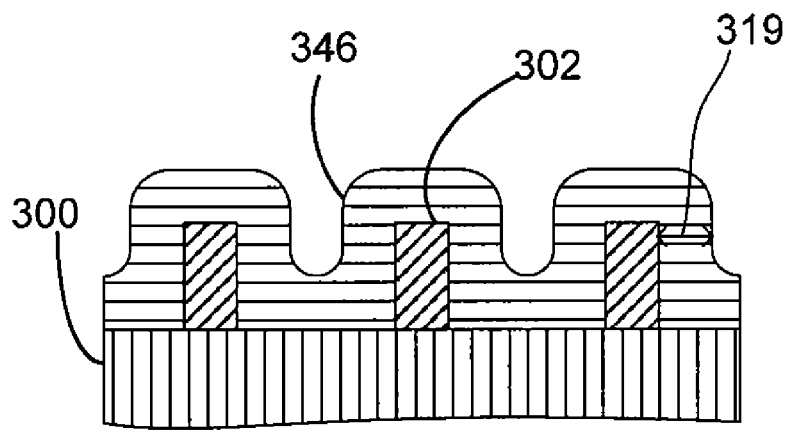

In step 262, conformal layer 346 of dielectric material is deposited on cores 302 and exposed substrate 323-1 resulting in the structure shown in FIG. 3B. Conformal layer 346 may be a dielectric layer such as a silicon oxide layer deposited with processes such as SACVD. Specific examples of a suitable SACVD oxide film include HARP™ films available from Applied Materials and spacer oxide, deposited on an ACE SACVD deposition system also available from Applied Materials.

Conformal layer 346 is preferably deposited to a sidewall thickness 319 approximately equal to the width of cores 302. As used herein, conformal coverage refers to providing a generally uniform layer of material on a surface in the same shape as the surface, i.e., the surface of the layer and the surface being covered are generally parallel. A person of skill in the art will recognize that the deposited material likely cannot be 100% conformal and thus the term "generally" allows for acceptable tolerances. The conformal layer may have sidewall thickness 319 between about 90% and about 110% or between about 95% and about 105% of the width of cores 302.

Figure 3C:
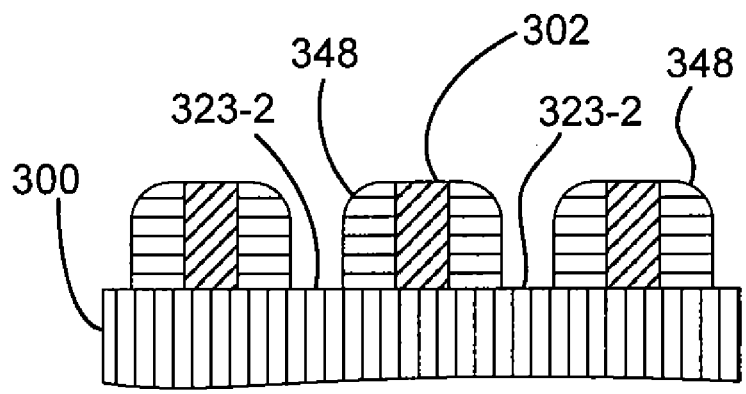
Figure 3D:
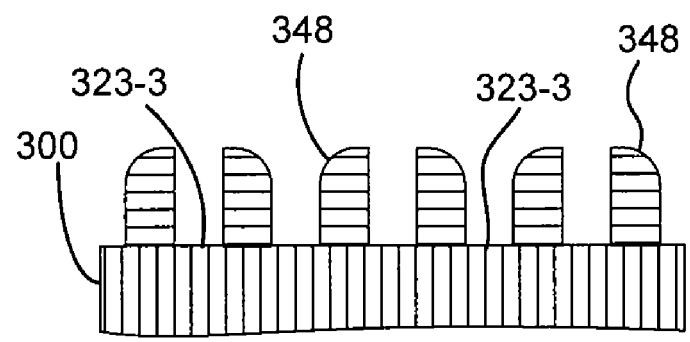
Figure 3E:
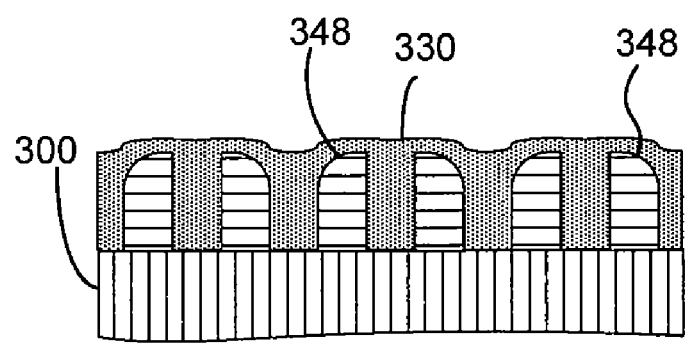

Conformal layer 346 is then anisotropically etched (a vertical etch) to expose substrate 300 in areas 323-2 and expose an upper surface of cores 302 (Step 264) as shown in FIG. 3C. The anisotropic etch step creates non-sacrificial ribs 348 on each side of cores 302. The non-sacrificial ribs are leftover portions of conformal layer 346 and may be dielectric spacers (as in this example) or conducting lines. Next, the exposed core material is removed (Step 266) in an etch step leaving non-sacrificial ribs 348 as shown in FIG. 3D. The etch step used to remove the core material exhibits a high selectivity in etching the core material relative to the conformal material of the non-sacrificial ribs (the spacer material). Following the etch, substrate 300 supports non-sacrificial ribs 348 with a pitch essentially half that of the pitch formed by the photolithography process described with reference to FIG. 3A. Metal layer 330 may be formed on the non-sacrificial ribs 348 and exposed surfaces of substrate 323, as shown in FIG. 3E, generally filling the spaces between non-sacrificial ribs 348 (Step 268).

Figure 3F:
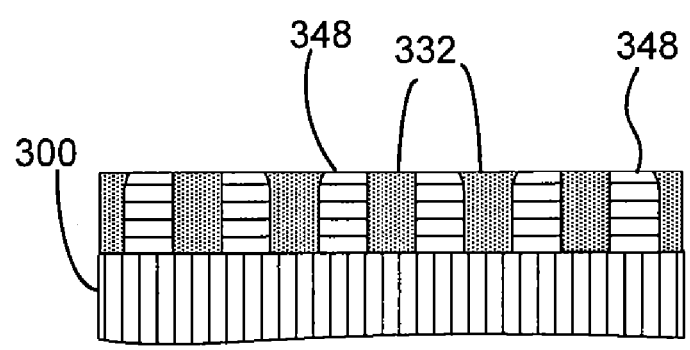

The top surface of metal layer 330 may be above the top surface of the non-sacrificial ribs 348 such that adjacent metal lines may be in electrical contact and are therefore not independently controllable. In order to allow adjacent lines to function independently, the top surface may be planarized with an etch-back or a chemical mechanical polishing (CMP) step to once again expose the tops of non-sacrificial ribs 348 (Step 270). Metal lines 332 created by exposing the dielectric spacers 348 are shown in FIG. 3F.

Exemplary conductors used for metal lines 332 may be tungsten, aluminum or copper and may be deposited with chemical vapor deposition, physical vapor deposition or electroplating. As used herein "substrate" may be a support substrate with or without layers formed thereon. The support substrate may be an insulator or a semiconductor of a variety of doping concentrations and profiles and may, for example, be a semiconductor substrate of the type used in the manufacture of integrated circuits.

There is also considerable flexibility in the choice of materials used for the cores and non-sacrificial ribs. Exemplary material systems may be helpful in explaining additional details of self-aligned double patterning processes according to disclosed embodiments. In an embodiment, cores 302 are a combination of amorphous carbon and hydrogen (hydrogenated amorphous carbon) while conformal layer 346 is silicon oxide. The hydrogenated amorphous carbon film may be Advanced Patterning Film™ (APF) made by Applied Materials of Santa Clara, Calif. APF is described in U.S. Pat. No. 6,573,030, which issued on Jun. 3, 2003, and which is herein incorporated by reference in its entirety for all purposes. Hydrogenated amorphous carbon may have an atomic composition of between about 10 percent hydrogen to about 60 percent hydrogen. Either lower temperature (e.g., 300° C.) or higher temperature (e.g., 480° C.) APF films can be used where the temperature refers to the deposition temperature of the film. In some embodiments deposition of conformal dielectric layer 346 is performed at or below the deposition temperature of the APF film to help ensure film stability.

The core-etch may involve ashing the amorphous carbon cores to attain the configuration of FIG. 3D. Ashing is often done by introducing $O_2$ or $O_3$ into a plasma above the substrate to oxidize the amorphous carbon and pumping the by-products away. The ashing process can also involve halogen-containing gases. When silicon oxide is used for conformal layer 346, the oxygen content near the interface with the hydrogenated amorphous carbon film can cause premature ashing. This may compromise the physical integrity of cores 302. To avoid premature ashing the deposition of silicon oxide may begin with a silicon-rich interface and transition to the normal stoichiometry of silicon oxide thereafter. The silicon rich interface has less oxygen content and suppresses premature ashing of cores 302.

The choice of materials used for the cores and the non-sacrificial ribs may be different from those described thus far. In order to obtain the benefits of the process flows described herein, the etch rate of the cores should be higher than the etch rate of the ribs 348. The difference enables the cores to be removed while leaving at least a portion the ribs 348. For hydrogenated amorphous carbon cores 302, the ribs may be made from any material with a lower ashing rate. Suitable materials include silicon dioxide, but also low-k dielectrics, silicon nitride and silicon oxynitride. The rib or spacer material may not include significant amounts of oxygen and/or halogens, in which case premature ashing of hydrogenated amorphous carbon cores may not be a problem. Properties of the spacer material should be suitable for incorporation between metal lines. Low-K dielectrics and silicon oxide are usually more desirable than silicon nitride for this application due to their lower dielectric constant.

Etch process gases and etch rates are often similar for silicon nitride and silicon oxide. Removing a silicon nitride core while leaving a silicon oxide spacer (or vice versa) may require an exotic etch and probably not be a likely choice. However, polysilicon may be used for the cores in combination with silicon nitride or silicon oxide spacers. In embodiments, the core material may be polysilicon or hydrogenated amorphous carbon while the rib or spacer material may be silicon nitride or silicon oxide.

Figure 4:
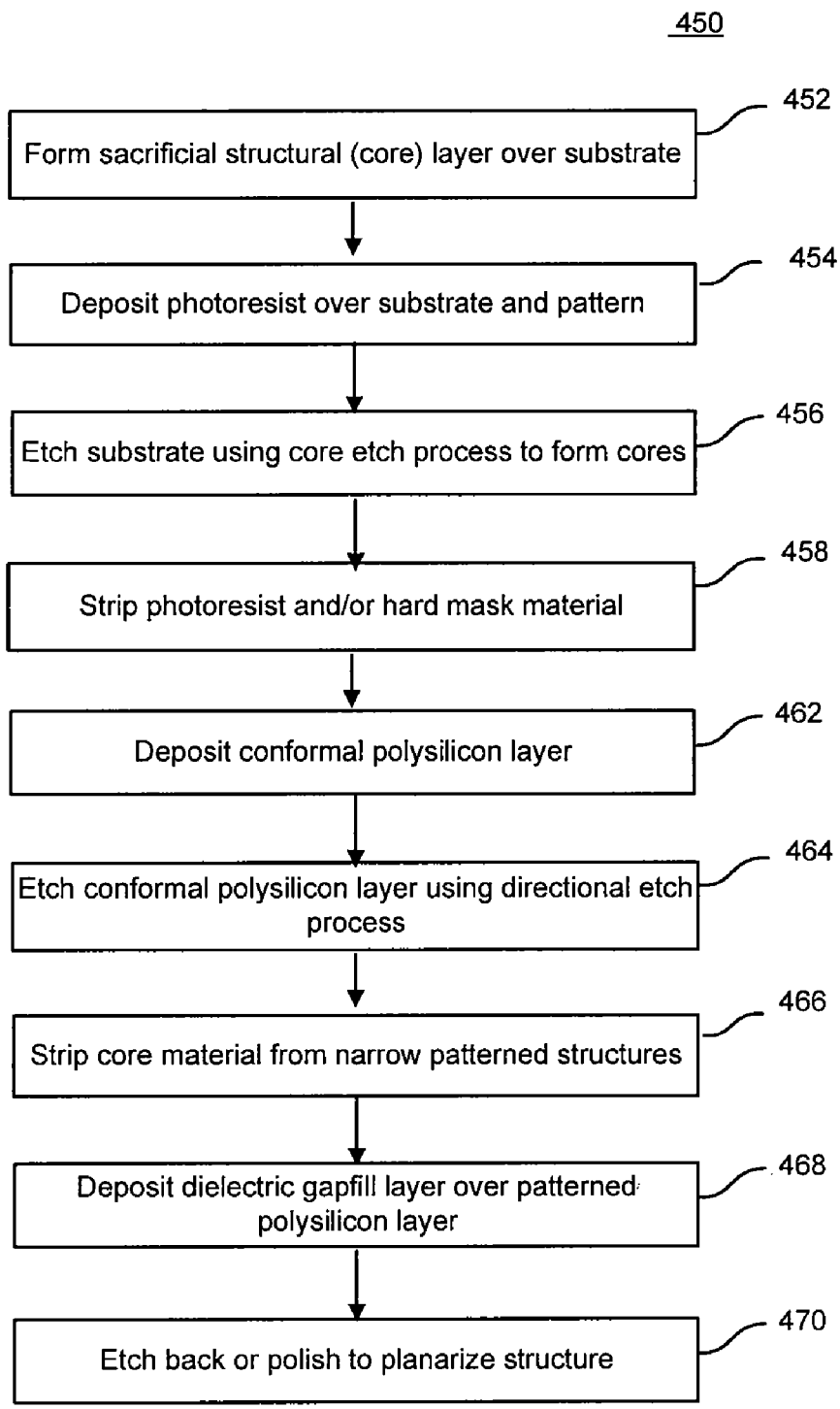
FIG. 4 is a flowchart depicting steps associated with a self-aligned double patterning process according to another embodiment of the invention.

In another embodiment of the invention, particularly well suited for forming polysilicon bit lines in a memory device, a conformal polysilicon layer is deposited over patterned cores 302 instead of a conformal dielectric layer. FIG. 4 is a flowchart depicting the steps associated with such an embodiment. Referring now to FIG. 4, steps 452-458 are similar to steps 252-258 discussed with respect to FIG. 2. Namely, a sacrificial structural core layer is formed over the substrate (step 452), coated with photoresist (step 454) and then patterned (step 456) to form a plurality of patterned cores at or near the resolution limit of the photolithography process. The photoresist is then stripped (step 458) using a standard photoresist stripping process if it was not already removed by the core etch and hard mask material may also be etched from the tops of the cores. The materials and processes used in steps 452-458 can be similar or identical to those described above with respect to steps 252-258.

Next, a conformal polysilicon layer is deposited over the patterned cores forming a structure that looks similar to that shown in FIG. 3B except that layer 346 is conductive polysilicon rather than an insulating dielectric material. The polysilicon layer can be an undoped polysilicon layer deposited in a chamber such as the SiGen LPCVD system available from Applied Materials. In some embodiments, the polysilicon layer is deposited (step 462) at a relatively high temperature in the 500-600 degree Celsius range in which case the sacrificial core material is a material that is stable when exposed to such higher temperatures. Examples of suitable core materials are APF 550 or APF 650 available from Applied Materials. In one embodiment, the conformal polysilicon layer is deposited to a sidewall thickness of between 90% and 110% of the thickness of the cores an in another embodiment between about 95% and 105% of the thickness of the cores.

The polysilicon layer is then etched in an anisotropic (directional) etch using a suitable etch chemistry (step 464) to expose the tops of the patterned cores and expose the substrate in an area of trenches formed between the patterned polysilicon lines resulting in a structure similar to what is shown in FIG. 3C. Then, the core material is stripped away leaving a plurality of trenches formed between adjacent polysilicon lines (step 466) and a structure that looks similar to shown in FIG. 3D except that non-sacrificial ribs 348 are polysilicon lines rather then ribs of dielectric material. A gapfill dielectric layer is then formed over the substrate using any known and appropriate gapfill deposition process thereby depositing dielectric material into and filling the trenches formed between adjacent polysilicon lines. One particular gapfill dielectric that can be used is a HARP silicon oxide layer available through Applied Materials. Finally, the structure is planarized to expose the tops of the polysilicon lines using a standard etchback or CMP process (step 470).

The description above has been given to help illustrate the principles of the present invention. It is not intended to limit the scope of the invention in any way. A large variety of variants are apparent, which are encompassed within the scope of this invention. Polysilicon lines may be formed on cores of silicon nitride, silicon oxide or hydrogenated amorphous carbon. Also, while the invention has been described in detail and with reference to specific examples thereof, it will be apparent to one skilled in the art that various changes and modifications can be made therein without departing from the spirit and scope thereof. These equivalents and alternatives are intended to be included within the scope of the present invention

What is claimed is:

1. A method of forming patterned metal features on a substrate, the method comprising:

forming a layer of sacrificial structural material on the substrate;

patterning the layer of sacrificial structural material using a photolithography process to form a plurality of cores with first linewidths separated by first trenches and spaced according to a first pitch;

forming a conformal layer of a dielectric spacer material over the plurality of cores without completely filling the first trenches there between;

anisotropically etching the conformal layer to expose the plurality of patterned sacrificial structures thereby forming a plurality of exposed cores;

stripping away the plurality exposed of cores leaving a plurality of non-sacrificial dielectric spacers separated by second trenches and spaced according to a second pitch that is approximately half the first pitch;

filling the trenches between the plurality of non-sacrificial dielectric spacers by forming a metal layer over the non-sacrificial spacers; and planarizing the substrate to create a substantially planar surface comprising areas of dielectric spacer material and areas of metal defining the patterned metal features.

2. The method of claim 1 wherein the plurality of cores spaced according to the first pitch are formed at or near the optical resolution of a photolithography system using a high resolution photomask.

3. The method of claim 1 wherein the conformal layer of a dielectric spacer material formed over the plurality of cores has a thickness on sidewalls of the plurality of cores between about 90% and about 110% of the first linewidths.

4. The method of claim 1 wherein the step of forming the conformal dielectric layer comprises forming a conformal dielectric layer, wherein a thickness of the dielectric layer on side walls of the plurality of cores is between about 95% and about 105% of the first linewidths.

5. The method of claim 1 wherein the metal layer comprises at least one of the group consisting of tungsten, copper and aluminum.

6. The method of claim 1 wherein the layer of sacrificial structural material comprises hydrogenated amorphous carbon.

7. The method of claim 1 wherein the layer of sacrificial structural material comprises amorphous carbon having a carbon to hydrogen ratio of between about 10 percent hydrogen to about 60 percent hydrogen.

8. The method of claim 1 wherein the layer of sacrificial structural material comprises spin-on carbon.

9. The method of claim 1 wherein the step of anisotropically etching the conformal layer comprises anisotropically etching the conformal layer with an anisotropic plasma etch step with at least about a 10:1 etch selectivity of the sacrificial structural material compared to the spacer material.

10. The method of claim 1 wherein the step of anisotropically etching the conformal layer comprises anisotropically etching the conformal layer such that a surface of the substrate is exposed.

11. The method of claim 1 wherein the metal features are metal lines.

12. A method of forming patterned polysilicon features on a substrate, the method comprising:
    forming a layer of sacrificial structural material on the substrate;
    patterning the layer of sacrificial structural material using a photolithography process to form a plurality of cores with first linewidths separated by first trenches and spaced according to a first pitch;
    forming a conformal layer of a polysilicon material over the plurality of cores without completely filling the first trenches there between;
    anisotropically etching the conformal layer to expose the plurality of cores;
    stripping away the exposed plurality of cores leaving a plurality of non-sacrificial polysilicon features separated by second trenches and spaced according to a second pitch that is less than the first pitch;
    filling the trenches between the plurality of non-sacrificial polysilicon features by depositing a dielectric gapfill layer over the polysilicon features; and
    planarizing the substrate to create a substantially planar surface comprising areas of polysilicon separated by areas of dielectric defining the patterned polysilicon features.

13. The method of claim 12 wherein the plurality of cores spaced according to the first pitch are formed at or near the optical resolution of a photolithography system using a high resolution photomask.

14. The method of claim 12 wherein the second pitch at which the plurality of non-sacrificial polysilicon features are spaced is approximately half the first pitch.

15. The method of claim 12 wherein the step of forming the thickness of the conformal layer on side walls of the plurality of cores is between about 90% and about 110% of the first linewidths.

16. The method of claim 12 wherein the patterned polysilicon features are polysilicon lines.

* * * * *